Nov. 20, 1951 P. WARE 2,575,856

SPIRAL TUNING DEVICE

Filed Aug. 12, 1949

INVENTOR.
PAUL WARE

BY Darby & Darby
Attorneys

Patented Nov. 20, 1951

2,575,856

UNITED STATES PATENT OFFICE 2,575,856

SPIRAL TUNING DEVICE

Paul Ware, Pompton Plains, N. J., assignor to Allen B. Du Mont Laboratories, Inc., Passaic, N. J., a corporation of Delaware Application August 12, 1949, Serial No. 109,833

4 Claims. (Cl. 116—124.4)

My invention relates to radio tuning indicating apparatus and the like, and particularly to tuning apparatus adapted for use in a television receiver.

Certain types of television receivers employ tuning devices continuously tunable from 49 to 216 megacycles per second. These receivers have the advantage that they cover in a single range five lower-frequency television bands ranging between 49 and 88 megacycles per second, a frequency-modulation band between 88 and 108 megacycles per second, and seven upper television channels between 174 and 216 megacycles per second. Because of their wide tunable range these receivers do not require front end switching, and hence enjoy certain advantages in performance, such as low frequency drift, low oscillator radiation, stable gain, and low internal noise.

However, because of the large tuning range, tuning indicators for these receivers require a long indicating scale in order to be clearly readable. Therefore, indicating dials for these receivers have utilized spiral scales.

It is an object of this invention to provide a tuning device in which a long easily read indicating scale is achieved in a small space.

It is a second object to provide a tuning device which is attractive and compact.

It is another object to provide a tuning device which is inexpensive and easy to manufacture.

It is a fourth object to provide a tuning device which is particularly adapted for use in television receivers.

Figure 1:
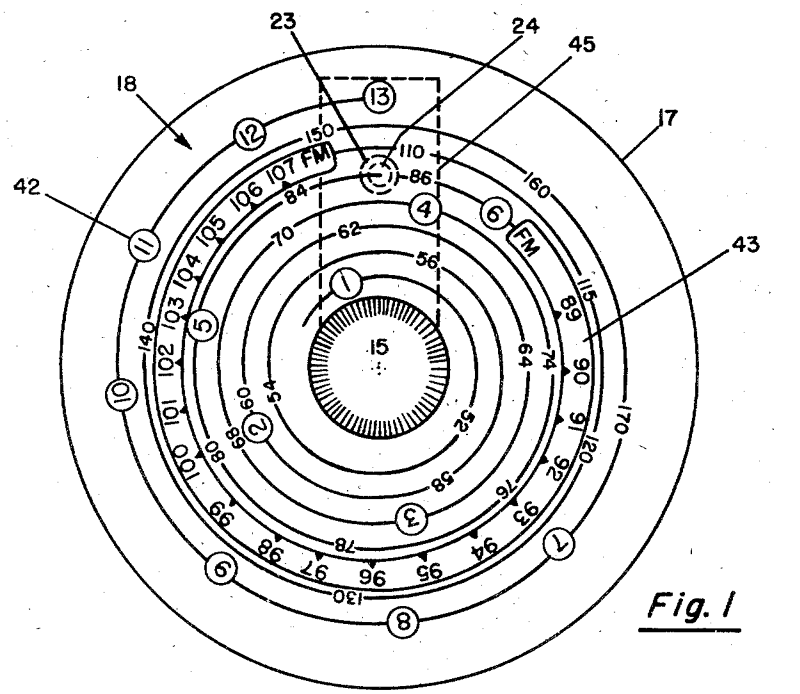
Figure 1 is a front view of a tuning device embodying my invention as it would be seen from the front of a television receiver.
Figure 2:
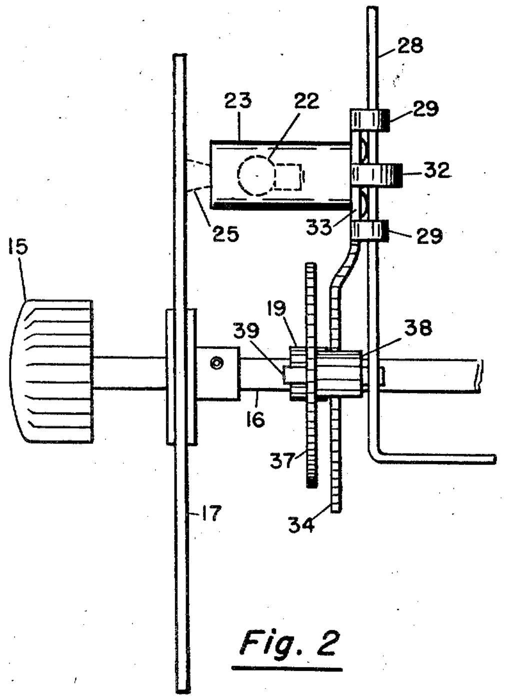
Figure 2 is a side view of the device of Figure 1.

In Figures 1 and 2, a manual tuning knob 15 is affixed to a tuning shaft 16 rotatable about its axis. The tuning shaft 16 operates a tuning mechanism (not shown) for a television receiver, this mechanism being of the type continuously tunable between 49 and 216 megacycles per second. On the tuning shaft 16 and rigidly attached thereto is a translucent dial 17. Upon the face of the dial 17 is a scale 18, arranged in the form of a seven-turn spiral comprising, in the order of frequency, television channel numbers 1–13 inclusive, frequency modulation frequencies between 88 and 108 megacycles, and additional indications of frequencies between 108 and 174 megacycles, which frequencies are at present not available to the public for broadcast purposes. Mounted on and rigidly attached to the tuning shaft 16 is also a gear wheel 19.

Directly behind the dial 17 is a small indicator in the form of a lamp 22. This lamp 22 is shown in dotted lines within a housing 23, the housing completely enclosing the lamp 22 except for a small opening 24 in the front of the housing. Through this opening 24 light shines out as indicated by the dotted lines 25, striking the dial 17 to form a small, clearly illuminated circle of light.

The lamp 22 is constrained to move along a vertical track 28 to which it is held by appendages 29 and 32 of a sliding member 33, an edge of which member 33 is shaped in the form of a rack gear 34.

Figure 3:
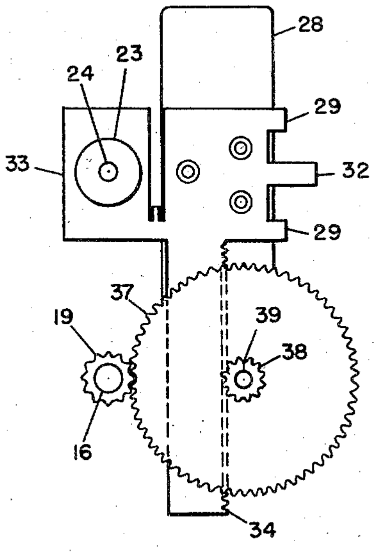
Figure 3 is a view of the mechanism in the device of Figure 1.

The mechanism linking the sliding motion of the indicating lamp 22 to the rotation of the scale 18 can be seen by referring to Figure 3. The gear wheel 19 engages a large idler gear wheel 37 rigidly attached to a small idler gear wheel 38, which latter wheel is free to revolve on an axle 39. The small idler gear 39 engages the rack gear 34.

The operation of the device is as follows. When the knob 15 is rotated, for instance in a clockwise direction, the indicator shaft 16 revolves, tuning the receiver and rotating the scale 18. Simultaneously the gear wheel 19 causes the idler gears 38 and 39 to revolve in a counter-clockwise direction. The latter gear 39 transmits motion to the rack gear 34, causing the platform 33 and the indicating lamp 22 to move downward. The gear ratios are such that the downward motion of the indicator lamp 22 just matches the downward evolution of the spiral scale 18 as the latter rotates, so that the light spot always clearly points out one spot in one and only one spiral of the scale.

When a television receiver is being observed, it is desirable that the attention of the observer be directed to the viewing of pictures and not distracted therefrom by tuning indicia. In this respect the above device has a unique advantage. The illuminated spot, being small, does not emit a large total quantity of light, and therefore does not distract the observer's attention from the picture. On the other hand, because the small indicating spot is relatively bright though confined in area, tuning figures on the scale 18 can be read clearly and easily, contributing to the ease of tuning, which is desirable.

In the preferred form of scale shown in Figure 1, the television channel numbers are indicated in black on a small red background 42. The frequency modulation transmitted frequencies are shown as black numerals in a green field 43, the latter being marked "FM" in black at either end of the band. The other frequencies, which are only occasionally used, are formed of an inconspicuous brown color. This preferred form of scale quickly instructs an inexperienced television viewer in the tuning of the set, for when the user wishes to listen to frequency-modulated programs he turns the knob until an essentially green indicating background appears. If on the other hand he wants to view television programs, the appearance of a red background indicates he is tuned approximately to a television station.

In one embodiment of my invention the entire dial is illuminated to a low level by means of an auxiliary pilot lamp. This has the advantage that the other stations can be seen dimly so that when stations are to be changed, the operator is shown beforehand approximately how far to turn the knob. In an alternate embodiment most of the dial is masked or concealed from view, there being a small visible section as outlined by the dotted lines 45 in Figure 1.

One feature of my invention that adds considerably to its attractiveness is its inherent symmetry about a vertical axis. All the elements which from functional reasons should be conspicuous to the operator are centered on this axis, these important elements being the tuning knob, the dial containing the scale and the indicating spot of light. Over the entire tuning range these conditions are maintained, the motion of the spot being exactly vertical, in an exactly straight line, and exactly radial to the center of the tuning shaft.

Although certain embodiments of my invention have been described, and their usefulness pointed out, the exact extent of my invention is in accordance with the following claims.

What is claimed is:

1. A tuning device for television, comprising a shaft, a translucent disc driven by and rotatable about the longitudinal axis of said shaft, and a source of light located behind said disc, geared to said shaft, and having a spiral scale thereon, said light being visible through said scale, said source being constrained to move exactly radially with respect to said axis, and masked to provide a small, relatively intense area of light upon said scale.

2. The tuning device in accordance with claim 1 in which television channel indications are portrayed on said disc in a first characteristic color and frequency modulaton indications are portrayed on said disc in a second characteristic color.

3. A tuning device in accordance with claim 1 in which said shaft has a gear, said indicator is affixed to a rack gear and an idler gear engages both said aforementioned gears.

4. A tuning device comprising a shaft, a disc of light transmitting material driven by said shaft and rotatable about an axis, said disc having a spiral scale thereon, a source of light, said light being visible through said disc and an indicator located behind said disc and geared to said shaft to move radially with respect to said axis and follow said spiral scale as said disc is rotated.

PAUL WARE.

REFERENCES CITED

The following references are of record in the file of this patent:

UNITED STATES PATENTS

| Number | Name | Date |
|---|---|---|
| 364,692 | Watkins | June 14, 1887 |
| 2,144,325 | Buchardt | Jan. 17, 1939 |
| 2,487,318 | Elliott | Nov. 8, 1949 |

FOREIGN PATENTS

| Number | Country | Date |
|---|---|---|
| 40,018 | Sweden | Jan. 19, 1916 |
| 771,301 | France | July 23, 1934 |